Figure 1:
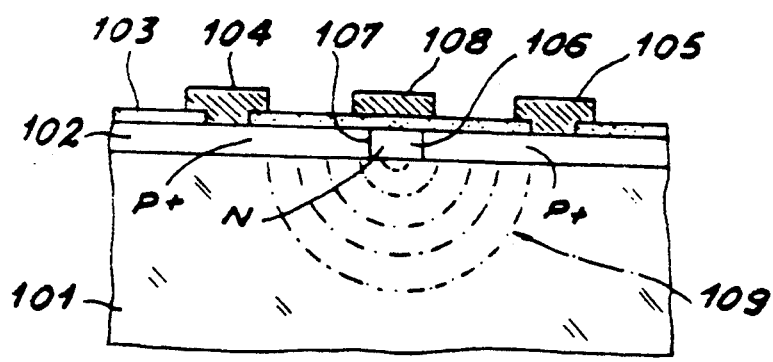

United States Patent [19]

Mercandalli et al.

[11] Patent Number: 5,397,735
[45] Date of Patent: Mar. 14, 1995

[54] PROCESS FOR HARDENING ACTIVE ELECTRONIC COMPONENTS AGAINST IONIZING RADIATIONS, AND HARDENED COMPONENTS OF LARGE DIMENSIONS

[75] Inventors: Louis Mercandalli, Montgeron; Didier Pribat, Sevres; Bernard Dessertenne, Bures Sur Yvette; Léonidas Karapiperis, Bourg la Reine; Dominique Dieumegard, Mareil-Marly, all of France

[73] Assignee: Thomson-CSF, Puteaux, France

[21] Appl. No.: 543,796

[22] PCT Filed: Nov. 21, 1989

[86] PCT No.: PCT/FR89/00598

§ 371 Date: Jul. 27, 1990

§ 102(e) Date: Jul. 27, 1990

[30] Foreign Application Priority Data

Dec. 9, 1988 [FR] France ................. 88 16212

[51] Int. Cl.$^6$ ............................................. H01L 21/20
[52] U.S. Cl. ............................................. 437/83; 437/84; 437/89; 437/90; 117/931; 117/934
[58] Field of Search .................. 437/89, 90, 83, 84; 156/603; 117/931, 934

[56] References Cited

U.S. PATENT DOCUMENTS

| | | | |
|---|---|---|---|
| 4,447,497 | 5/1985 | Manaserit | 156/DIG. 66 |
| 4,522,662 | 6/1985 | Bradbury et al. | 437/89 |
| 4,565,584 | 1/1986 | Tamura et al. | 437/89 |
| 4,661,176 | 4/1987 | Manaserit | 156/613 |
| 4,801,351 | 1/1989 | Awane | 156/603 |
| 4,834,809 | 5/1989 | Kakihara | 437/82 |
| 5,013,681 | 5/1991 | Godbey et al. | 437/83 |

FOREIGN PATENT DOCUMENTS

| | | |
|---|---|---|
| 0021643 | 1/1981 | European Pat. Off. . |
| 0099570 | 2/1984 | European Pat. Off. . |
| 0115035 | 8/1984 | European Pat. Off. . |
| 0102244 | 5/1988 | Japan ................. 437/83 |
| 8700689 | 1/1987 | WIPO . |

OTHER PUBLICATIONS

Patent Abstracts of Japan, vol. 9, No. 295 (E-360)(2018), 21 Nov. 1985, & JP, A, 60134448 (Nippon Denshin Denwa Kosha) 17 Jul. 1985.

Applied Physics Letters, vol. 42, No. 6, 15 Mar. 1983, American Institute of Physics, (New York, US), I. Golecki et al.: "Heteroepitaxial Si films on yttria-stabilized, cubic zirconia substrates", pp. 501–503.

*Primary Examiner*—R. Bruce Breneman
*Assistant Examiner*—Matthew Whipple
*Attorney, Agent, or Firm*—Oblon, Spivak, McClelland, Maier, & Neustadt

[57] ABSTRACT

The invention relates to the "hardening" (resistance to ionizing radiations) of MOS-type components. In order to avoid the effects of these radiations (creation of electron-hole pairs), there is deposited on a substrate (1) of monocrystalline Si a layer of YSZ (2), and then a thin layer of monocrystalline Si (3). The other steps of production of the components are the same as conventional.

20 Claims, 4 Drawing Sheets

PROCESS FOR HARDENING ACTIVE ELECTRONIC COMPONENTS AGAINST IONIZING RADIATIONS, AND HARDENED COMPONENTS OF LARGE DIMENSIONS

The invention relates to a process for hardening active electronic components against ionizing radiations, and to hardened components produced on substrates of large dimensions, especially components which are of the CMOS type or bipolar.

In schematic terms, the radiation-material interaction breaks down into two types of effect: (i) the displacements of atoms due to phenomena of collisions with the charged or uncharged particles (protons, alpha particles, electrons, neutrons, etc . . . ) and (ii) the ionization phenomena due to the absorption of the electromagnetic radiation ($\gamma$ and X rays). These two effects are liable to cause transitory or cumulative damage to electronic components.

Thus, under the action of the electric field prevailing in a junction or in a biased insulator, the two populations of carriers created by the irradiation (photogenerated carriers) are separated; this prevents their immediate recombination.

With regard to semiconductor materials and circuits, this effect of separation of photogenerated electron-hole pairs is reflected in the appearance of photocurrents which induce parasitic phenomena. Thus, the "Single Event Upset" (SEU), that is to say the occasional and localized accidental changing of a logic level; thus, again, "the Upset", that is to say the accidental but non-localized changing of a logic level associated with the propagation in the circuit of the disturbances initiated by the radiations; thus, finally, the phenomenon of "latch-up", that is to say the initiation of a pn pn parasitic tracking which is self-maintained in the CMOS devices on a solid silicon substrate.

As regards the insulators (especially of silica), the ionization effects are essentially reflected by a trapping of the photogenerated holes. In fact, the mobility of the holes in $SiO_2$ being lower by some five orders of magnitude than that of the electrons, in the course of a transitory irradiation, the latter are swept by the electric field, while the former, by reason of their low mobility, remain trapped. The result of this is, for the components of the MOS type, an accumulation of fixed charges in the gate oxide which induces a drift of the threshold voltage as well as breakdown phenomena when this gate oxide is very thin.

On the other hand, the accumulation of fixed charges in the field oxides may also induce a phenomenon of surface conduction (inversion or accumulation from the subjacent semiconductor), the effect of which is to short-circuit adjacent components.

Various solutions have been found to remedy the aforementioned disadvantages. These solutions (hardening solutions) are based, on the one hand, on modifications regarding the design of the circuits and, on the other hand, on modifications regarding the technology of construction of these circuits.

Thus, by adding a pair of crossed resistors in the scheme of the basic cell of a RAM memory, an increase is achieved in the RC time constant of this cell in such a manner that the transient effects associated with the "Single Event Upset" have disappeared before the cell has had time to flip over (see, for example, Andrews et al. IEEE Transactions on Nuclear Science, Vol. NS-29, December 1982).

With regard to the technology, a reduction is made in the volume of all the zones in which electric fields prevail (the thickness of the gate oxides, the dimensions of the well p in the CMOS components, etc...), guard rings are installed in order to avoid the formation of the parasitic path giving rise to the effect of latch-up, etc... (See, for example Ansell and Tirado, in VLSI Systems Design, September 1986, p. 28).

However, the most highly appreciated technologies for the elimination of the isolation Junctions and of the effect of "latch-up" are based on the use of thin layers of silicon on insulating or SOI ("Silicon On Insulator") substrates. Thus, the de facto elimination of the parasitic path passing through the semiconductor substrate is achieved, and, furthermore, as the insulation between components is made by engraving, the suppression is also achieved not only of the isolation junctions but also of a certain number of technological steps of oxidation, of engraving, and of diffusion or ion implantation, which are as many operations saved in the course of the production of a component or of a circuit.

The most widespread of the SOI systems is the SOS ("Silicon On Sapphire") composite which is available in the form of a thin layer of monocrystalline silicon grown by heteroepitaxyon a monocrystalline variety of alumina, namely sapphire.

Recently, however, other SOI systems have emerged, especially the system SIMOX (for "Silicon isolated by IMplanted OXygen") which consists of a thin layer of monocrystalline silicon, this layer being separated from the substrate, also of monocrystalline silicon, by a layer of silica $SiO_2$ obtained by ion implantation of a very high dose of oxygen in the initial substrate (for further details, see, for example, publisher Cullen, "Special Issue of the Journal of Crystal Growth" 63, 3, 1983). The system S D B (for "Silicon Direct Bonding") is also known, which consists in bonding face to face two oxidized wafers of silicon and in then thinning one of them, in such a manner as to reduce the silicon to a layer of thickness close to one micron (see W. A. Krull et al. IEEE Circuits and Devices Mag. Jul. 20, 2987 (sic); see also J. Onura et al. IEEE Electron. Device Lett. EDL 8/10, 454, 1987).

On the other hand, in the field of heteroepitaxies, there has also been the recent appearance of monocrystalline substrates different from sapphire and especially yttriated zirconia (YZS for "Yttria-Stabilized Zirconia") which presents, as compared with sapphire, this first advantage of being of cubic structure just like silicon (see, for example, Golecki et al., Applied Physics Letters, 42, 501, 1983).

The zirconias stabilized with yttrium oxide also exhibit, as compared with sapphire, this second advantage of being far less good photoconductors under intense irradiation.

In fact, if reference is made to FIG. 1, it is found that in the course of an irradiation of a MOS-SOS component, there appears between source and drain a photoconduction path through the sapphire substrate, the effect of which is to short-circuit the channel of the MOS transistor produced on this substrate.

Nevertheless, if consideration is given to the compared values of the products $\mu.\delta$ in various substrates (where $\mu$ is the mobility of the photogenerated carriers, expressed in $cm^2 V^{-1} s^{-1}$ and $\delta$ their lifetime in seconds) it is found that the yttriated zirconia is far less subject to the phenomenon of photoconduction under irradiation than is sapphire. Thus, under conditions of low injection (irradiations of the order of 100 rad (Si) s$^{-1}$) $\mu.\delta$ is of the order of 3 10$^{-8}$ cm$^2$ V$^{-1}$ in yttriated zirconia, as compared with 2 10$^{-7}$ cm$^2$ V$^{-1}$ in sapphire, while under conditions of strong injection (irradiations of 6 10$^{10}$ rad (Si) s$^{-1}$) $\mu.\delta$ is of the order of 5 10$^{-12}$ cm$^2$ V$^{-1}$ in yttriated zirconia as compared with 10$^{-9}$ in sapphire (see Dupont-Nivet et al. Abstract No. 134, 173rd Meeting of the Electrochemical Society, Atlanta, Ga., May 15–20, 1988).

On the other hand, as regards permanent damage, the charges in movement under irradiation in the sapphire substrate remain trapped when the irradiation effects are softened. This trapping close to the sapphire/silicon interface is liable to induce modifications of the channel base conductivity (inversion or accumulation in the semiconductor) which are reflected in the appearance of a permanent short-circuit between the source and the drain of the MOS transistor under consideration. Thus, it has recently been shown on MOS transistors of n type (the case where the channel base leakage current is most sensitive to ionizing radiations) after an irradiation corresponding to an absorbed dose of 1 megarad, the channel base leakage current was 1 nA per micron of gate width for the structure Si/YSZ, while it was 100 nA per micron of gate width for the structure Si/sapphire (see, for example, Dupont-Nivel et al. 173rd Meeting of the Electrochemical Society, Atlanta, Ga., May 15–20, 1988).

Thus, in summary, yttriated zirconia appears to be an ideal substrate for the production of hardened electronic components. The principal disadvantage of this material is that its melting point is very high (of the order of 2700° C., varying slightly with the yttrium oxide content, and as compared with 2053° C. for sapphire); this makes it virtually impossible to draw monocrystals of large dimensions by industrial methods such as the Czochralsky method or the EFG (Edge-defined Film-fed Growth method) method.

The only crystals available on the market are those (obtained by cooling in an automatic well or Skull Melting) permitting the production of wafers (100) of a maximum diameter of 50 mm (as compared with wafers of sapphire or of SIMOX of 100 mm and above).

The subject of the present invention is a process for the production of MOS or bipolar components permitting the aforementioned effects of ionizing radiations to be made negligible, these being effects which are particularly sensitive on the MOS-type circuits and components and which essentially consist of the creation of electron-hole pairs.

The essential advantage of the invention is based on the possibility of producing these components on substrates of large diameters, that is to say 100 mm and above.

The subject of the present invention is also a basic structure of MOS or bipolar components, which are virtually insensitive to the effects of ionizing radiations, these components being produced on a substrate having a diameter which may be of at least 100 mm.

The process of the invention for the production of basic structures of such components is characterized by the formation on a substrate of monocrystalline silicon having dimensions which may exceed 100 mm, of a layer of "hardening" material exhibiting a product $\mu.\delta$ less than approximately 5.10$^{-8}$ cm$^2$.V$^{-1}$, this layer being covered with a layer of monocrystalline silicon obtained by recrystallization by bonding or by nucleation. Advantageously, the said product is of yttriated zirconia.

The MOS component basic structure according to the invention comprises, in succession, a substrate of silicon, a layer of material resistant to the effects of ionizing radiations, and a layer of silicon which is at least partially monocrystalline.

Thus, the invention permits the isolation, by means of a material of very low photoconductivity, of the active components produced in the surface regions of a substrate which is in general photoconductive (semiconductor or insulator); the invention thus permits the increasing of the immunity of these components in relation to the photocurrents generated in the substrate under intense irradiation.

Figure 3:
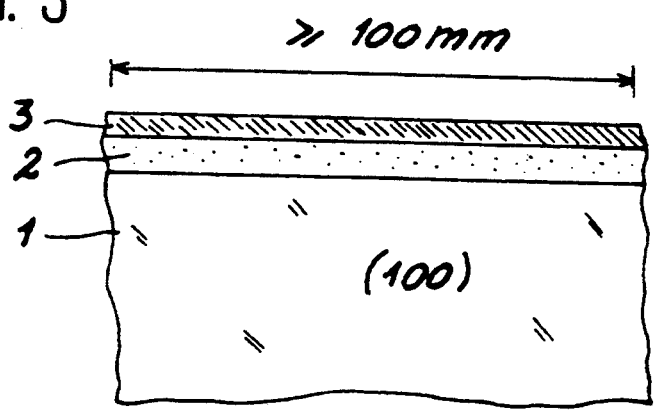
Figure 4:
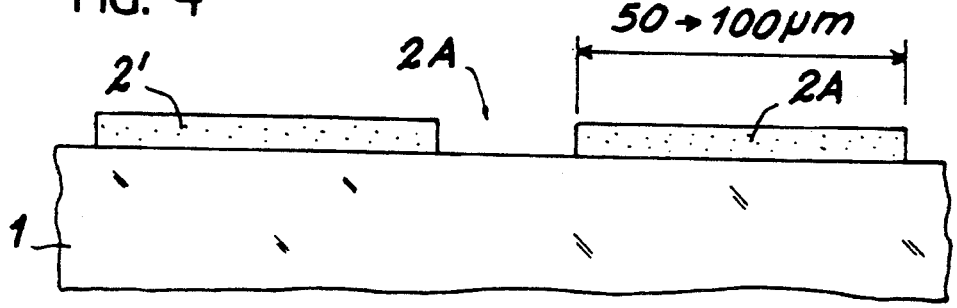
Figure 6:
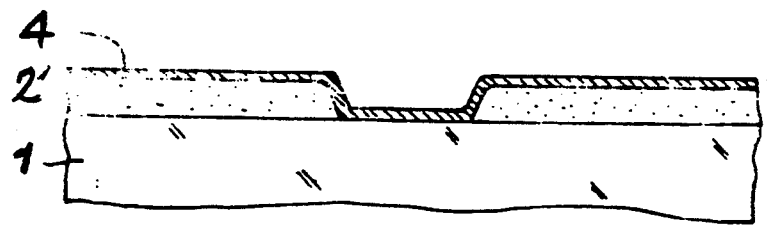
Figure 2:
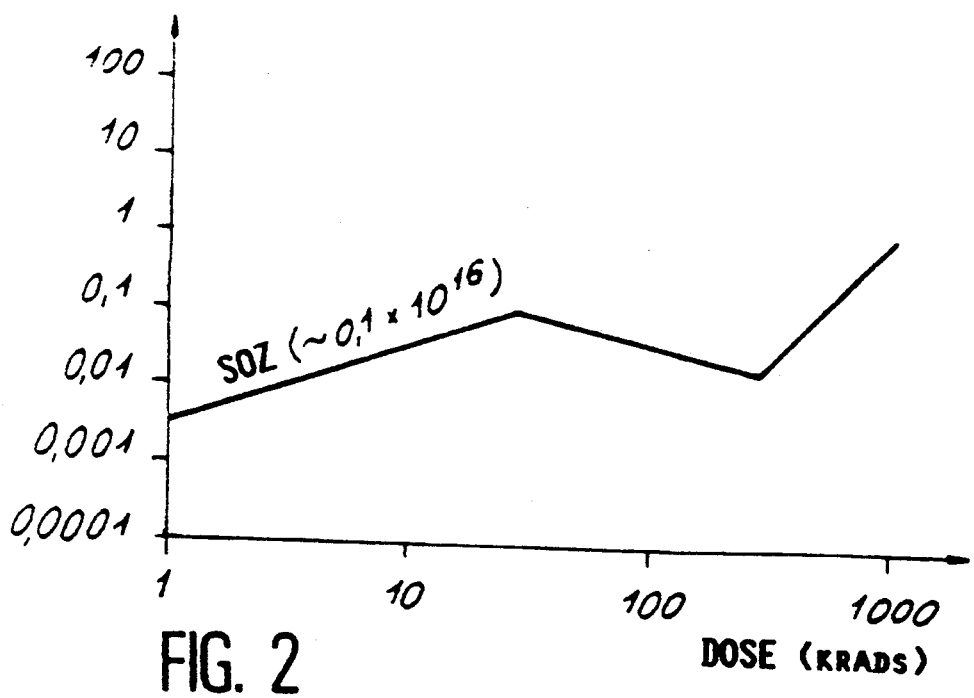
Figure 5:
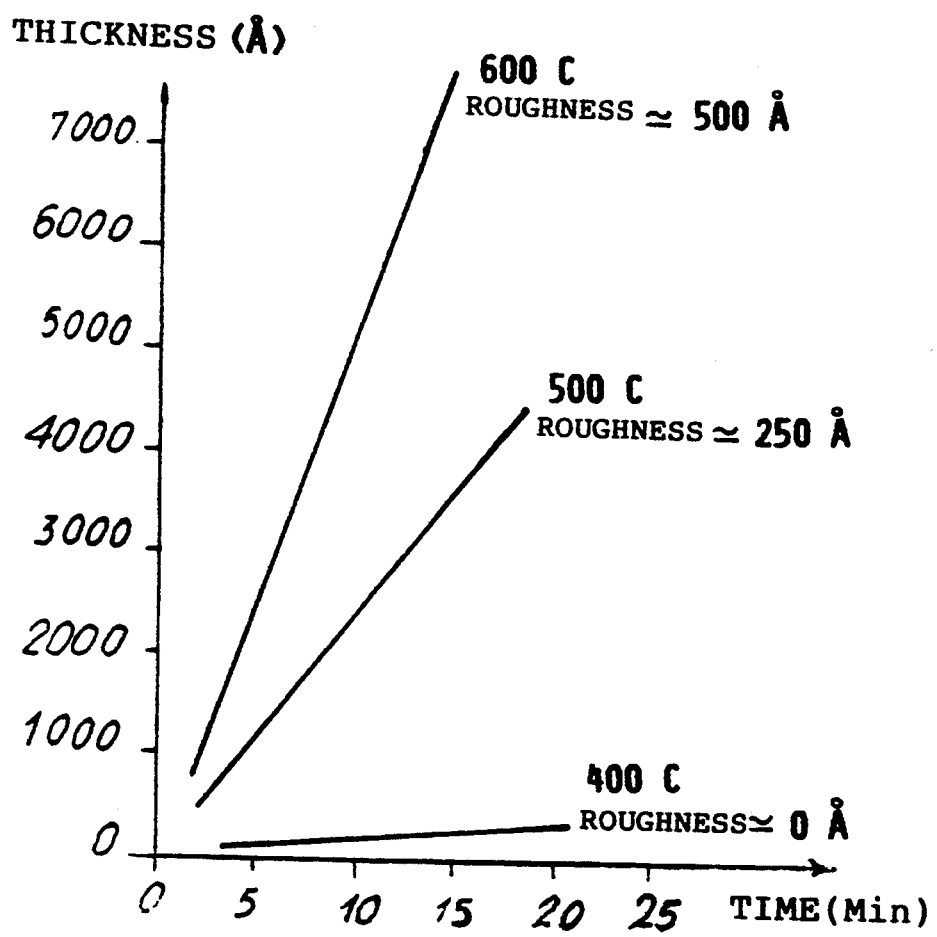
Figure 7:
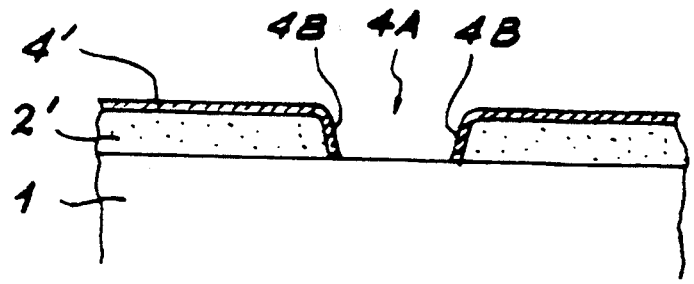
Figure 8:
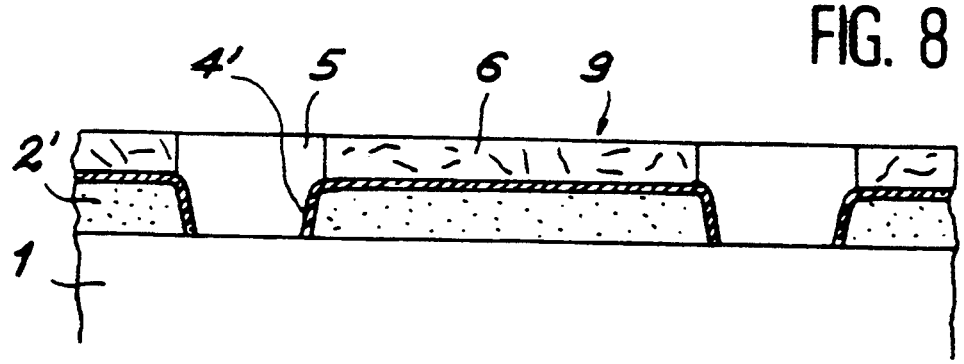
Figure 9:
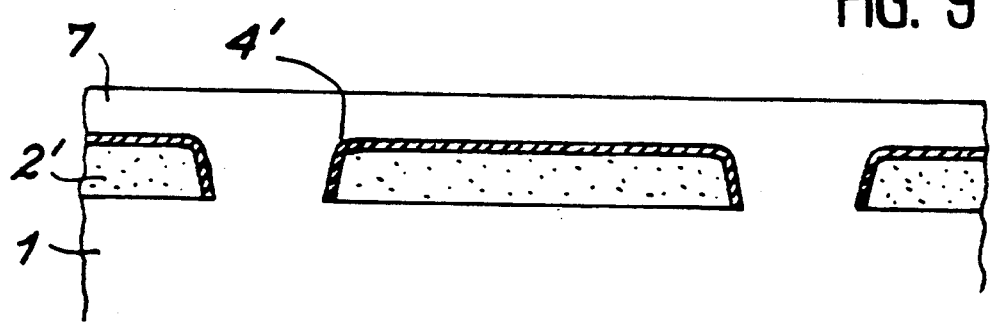
Figure 10:
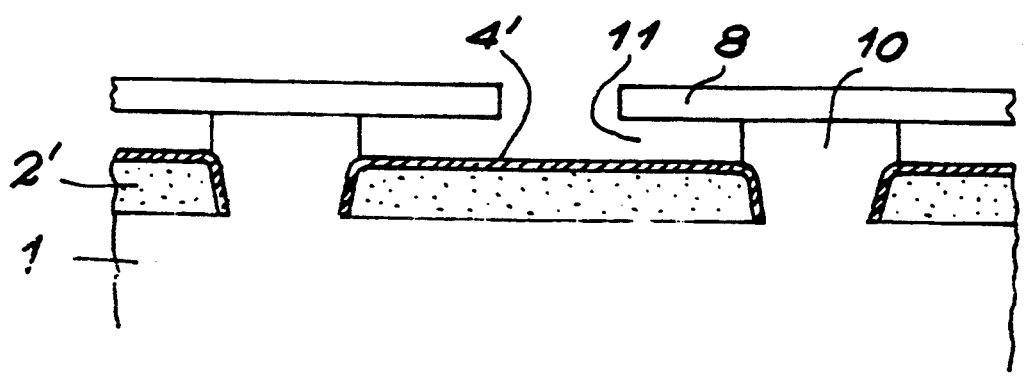
Figure 11A:
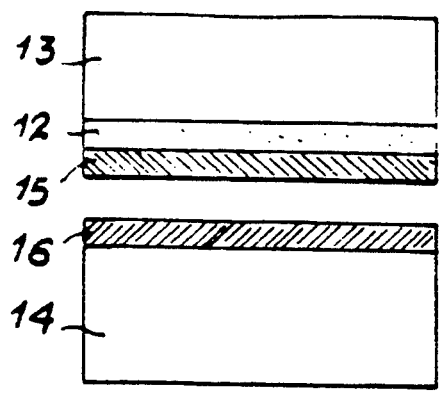
Figure 11B:
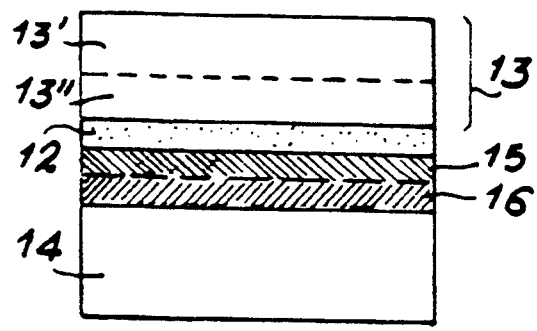

The present invention will be better understood on reading the detailed description of a plurality of embodiments, taken as non-limiting examples and illustrated by the accompanying drawing, in which:

FIG. 1, already mentioned hereinabove, is a diagrammatic cross-sectional view of an MOS-SOS component of the prior art, FIG. 2, already mentioned hereinabove, is a diagram of the channel base leakage current of a component of structure Si/YSZ of the prior art, FIG. 3 is a simplified cross-sectional view of a component basic structure according to the invention, FIGS. 4 and 6 to 8 are diagrammatic cross-sections illustrating the successive steps of the process of the invention permitting the production of a layer of silicon of the basic structure by recrystallization or by nucleation, FIG. 5 is a diagram permitting the determination of the conditions of deposit of a layer of amorphous silicon represented in FIG. 6, FIGS. 9 and 10 illustrating two different possibilities for the production of a thin layer of monocrystalline silicon for the basic structure, and FIGS. 11A and 11B to 15 are simplified cross-sectional views illustrating several variants according to the invention of the bonding process.

A description will be given hereinbelow of several possibilities of implementation of the process of the invention permitting the production of components, discrete or integrated, of the MOS type (CMOS, MOS-SOS, etc.) or bipolar. A description will be given hereinbelow only of the steps of production of the basic structure of these components, that is to say the substrate and the first layers deposited on this substrate, at the location where the aforementioned effects of ionization take place. The other layers of these components (visible in FIG. 1) are produced in the conventional manner, and will therefore not be described here.

The basic structure of the invention, represented in a simplified manner in FIG. 3, comprises, in succession, a substrate 1 of monocrystalline silicon, a layer 2 of stabilized zirconia, and a layer 3 of monocrystalline silicon. The substrate 1 may be of large dimensions: if it is round, its diameter may be at least approximately 100 mm. Nevertheless, it is of course understood that the invention is not limited to substrates of large dimensions, and that dimensions below 100 mm form part thereof. In the preferred embodiment, the layer 2 is of stabilized zirconia which is not necessarily monocrystalline, but any material exhibiting a product $\mu.\delta$ (defined hereinabove) below approximately 5.10$^{-8}$ under any condition of irradiation falls within the scope of the invention. The thickness of the layer 2 is advantageously approximately 1 micrometer. The layer 3, of monocrystalline Silicon, advantageously has a thickness below 1 micrometer. This layer 3 may be obtained, as explained hereinbelow, by recrystallization, forced lateral epitaxy, or by bonding.

A description will first of all be given of the steps A1 to A7 permitting the production of the layer 3 of monocrystalline silicon by recrystallization or by nucleation.

The starting point is a substrate 1 of monocrystalline silicon (100) in the form of a disc of a diameter of approximately 100 to 130 mm (see FIG. 4).

A1: there is deposited on this substrate 1, by reactive cathode sputtering for example, or by any other method known to a person skilled in the art, a thin layer 2' of zirconia stabilized with yttrium oxide having a typical thickness of a few thousand angstroms. This layer of stabilized zirconia is polycrystalline, with grains having a size which is typically of the same order of magnitude as the thickness of the layer 2.

A2: after this deposit, an annealing is carried out under an oxygen atmosphere, typically at 1000° C. for a few minutes, in order to stabilize the composition of the layer of zirconia and the substrate/zirconia interface.

A3: zones 2A of nucleation are engraved, by the methods known to a person skilled in the art (for example plasma $CF_4+He$), in the layer of stabilized zirconia. According to an advantageous embodiment, these nucleation zones are parallel bands having a width of approximately 1 to 5 micrometers. This engraving bares nucleation zones which will permit the subsequent recrystallization or the lateral epitaxial growth of the upper thin layer of silicon (layer 3 of FIG. 3). The spacing between two bands may vary between a few tens and a few hundreds of micrometers, depending upon the selected method of formation of the layer 3.

A4: there is deposited on the preceding assembly a continuous layer 4 of amorphous silicon of a thickness of approximately 50 angstroms (see FIG. 6). This deposit is advantageously produced by CVD ("Chemical vapor Deposition"), at a temperature of approximately 400° C., by using silane ($SiH_4$). Such conditions are optimal for the production of a layer of amorphous silicon which is continuous and of virtually no roughness on a substrate of yttriated zirconia, as is seen according to FIG. 5. FIG. 5 shows the variations of the thickness of a layer of amorphous silicon obtained from silane as a function of the deposit time for three different deposit temperatures (temperatures of 400°, 500° and 600° C.) for which the roughness of the layer of silicon is approximately 0.250 and 500 Å respectively). This process of deposition, under the aforementioned conditions, is the only currently known one which permits the production of layers which are very thin (of approximately 50 Å) and continuous. The structure obtained at the end of this step is shown in FIG. 6.

A5: thermal oxidation is carried out of the layer 4 of amorphous silicon in such a manner as to obtain a continuous film 4' of silica. This oxidation may be carried out under an atmosphere of oxygen or of water vapour, at a temperature of approximately 1000° C. This film of silica is a material which is amorphous at all temperatures, and it encapsulates the surface of the deposit 2' of stabilized zirconia. This encapsulation is useful since, as the stabilized zirconia is polycrystalline and not amorphous, it is desired to avoid in the course of the recrystallization or of the subsequent growth of the upper thin layer of silicon (3) random and parasitic phenomena of crystallization of the silicon on the microcrystals of zirconia.

A6: openings 4A are formed in the layer 4 of silica, corresponding to the zones 2A, but taking care to leave the flanks 4B of the layer 4 masked, in order not to uncover the layer of zirconia 2', and to prevent a situation in which microcrystals of zirconia, of random orientation, come to disturb the subsequent recrystallization of the silicon (see FIG. 7).

A7: under conditions of selective epitaxy, the depositing takes place of monocrystalline silicon 5 on the openings 4A, that is to say on the substrate 1 of monocrystalline silicon. In the course of this step, the simultaneous depositing takes place of polycrystalline silicon 6 on the silica 4' (see, for example, French Patent Application 88/04,437). The structure as shown in FIG. 8 is then obtained. Details can be found concerning the performance of the process of selective epitaxy by APCVD ("Atmospheric pressure chemical vapor deposition") or RPCVD ("Reduced pressure CVD") in the articles published, on the one hand, by BORLAND and DROWLEY in "Solid State Technology, August 1985, page 141, and, on the other hand, by KARAPIPERIS et al. in "Proceedings of the MRS Meeting, Symposium on SOI", Boston, December 1987.

Proceeding from the structure thus obtained and represented in FIG. 8, it is possible to implement several methods for obtaining a thin layer of monocrystalline silicon on the stabilized zirconia encapsulated by silica.

A8-1 First method: the deposit of silicon (5+6) is encapsulated by means of $SiO_2$ or of $Si_3N_4$ deposited by a high-temperature CVD process (HTO type for "High Temperature Oxide") and it is recrystallized by fusion of the polycrystalline material by means of a laser beam or of an electron beam. The details of these techniques are not described here, since these are known per se from the article by D. CHAPUIS et al. in "ESPRIT'87 Achievements and Impact", Part 1, North Holland, 55, 1987.

What is obtained in this manner, after elimination of the substance encapsulating the layers (5+6), is a structure as represented in FIG. 9, where the layer 7 is of monocrystalline silicon. The bands of monocrystalline silicon of the layer 7 on top of the bands 2' of stabilized zirconia may reach lateral dimensions of the order of 50 micrometers without grain sub-junctions, and of the order of a few hundred micrometers if a few of these grain sub-junctions are tolerated in the monocrystalline layer.

A8-2 Second method: the deposit (5+6) obtained during the step A7 is encapsulated by means of for example $SiO_2$, in the encapsulating substance 8 there is opened a network of bands comparable to those obtained during the step A3, but situated above the central part 9 of each deposit 6 of polycrystalline silicon, and through these bands this polycrystalline silicon is attacked, in such a manner as to bare the lateral nuclei 10 of monocrystalline silicon (these nuclei 10 are, in fact, bands of the layer 5 which are lightly attacked laterally to be fully cleared of polycrystalline silicon of the layer 6, the separation between these layers 5 and 6 not being very clear). The structure represented in FIG. 10 is then obtained.

There is then performed, by lateral growth in the vapour phase, and under conditions of selective epitaxy, the filling of the bands 11 left empty by the attacking of the polycrystalline silicon. This process step is described in detail in French Patent Applications 88/04,437 and 88/04,438.

What is obtained, after elimination of the encapsulating substance 8, is a structure similar to that represented in FIG. 9, the lateral extension of the bands of monocrystalline silicon on the stabilized zirconia possibly reaching about one hundred micrometers.

The embodiments described hereinabove by way of examples relate to the use of silicon, but it is of course understood that the invention is not limited to this material, and may be implemented, especially with regard to the step A8-2, with semiconductor materials of groups III-V (such as GaAs, InP . . .) or II-VI.

A description will now be given of a variant of the process of the invention, referred to as the SDB ("Silicon Direct Bonding") method. This method is based on the principle of bonding of two substrates of silicon with interposition of an insulating film between them.

One of the substrates is in the form of a thin layer 12, having a thickness of a few micrometers, of monocrystalline silicon epitaxially grown on a substrate 13 of highly doped silicon, of orientation <100>. The other substrate 14, which will serve as support subsequently, has any orientation and any doping (see FIG. 11A).

Step B1: there is deposited, or there is formed by oxidation, on one or both substrates, a layer of "hardening" material having a typical thickness of a few thousand angstroms. In the example represented in FIG. 11A, this hardening layer is formed on both substrates. That formed on the layer 12 of the substrate 13 is referenced 15, and that formed on the substrate 14 is referenced 16.

Step B2: after cleaning of the insulating surface of the two parts, in order to avoid virtually any contamination of these surfaces, the hardened surfaces 15,16 of the two parts are pressed against one another at ambient temperature. The Van der Waals forces are sufficiently strong between the surfaces to maintain the adhesion of the substrates. Subsequently, the intimate connection of the layers 15,16 is obtained by a high-temperature heat treatment.

Step B3: after bonding, the substrate 13 is thinned mechanically, and then mechano-chemically, to achieve a thickness of approximately 25 micrometers. A chemical attack in a selective solution terminates the thinning up to the highly doped Si (13)/epitaxially grown Si (12) interface; the attack is automatically arrested on account of the difference in doping. What is then obtained is the basic structure of FIG. 11B (similar to that of FIG. 3) for which the parts eliminated have been represented in broken lines.

A description will now be given, with reference to FIGS. 12 to 15, of various possibilities for the construction of the insulating films 15,16, which are, for the preferred embodiment, of yttriated zirconia (YSZ), but could be of any other material exhibiting a product $\mu.\delta$ of less than $5.10^{-8}$ as already specified hereinabove.

Figure 12:
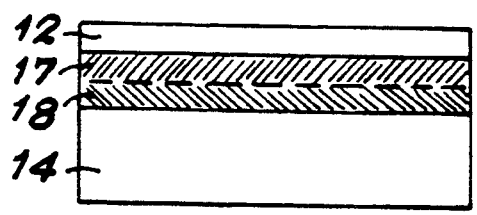

First method (FIG. 12). A thin layer (approximately 1 micrometer) of YSZ 17,18 is deposited on both substrates, or possibly on one of them, and then the layers 17,18 are applied against one another and they are bonded by assembly and thermal annealing. The substrate 13 is then eliminated, as described in B3.

Figure 13:
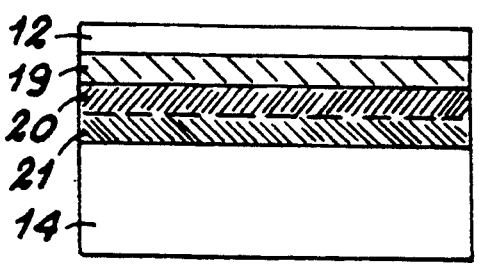

Second method (FIG. 13). There are deposited in succession on the epitaxially grown sample (13+12) a thin layer of YSZ 19, then a layer 20 of amorphous silicon or of the silica obtained by a high-temperature process (by cracking of silane in N$_2$O for example at approximately 850° C.) of a thickness of a few hundred to a few thousand angstroms. If amorphous silicon is deposited, as represented in FIG. 13, this is then oxidized, in such a manner as to obtain a thin layer of silica (20). The substrate 14 is then surface-oxidized over a thickness of a few hundred to a few thousand angstroms (layer 21 of silica) and then the two structures supported by the substrates 13 and 14 are bonded at high temperature, as indicated in step B2. Finally, the substrate 13 is eliminated in accordance with the step B3, in such a manner as to obtain the final structure of FIG. 13.

Figure 14:
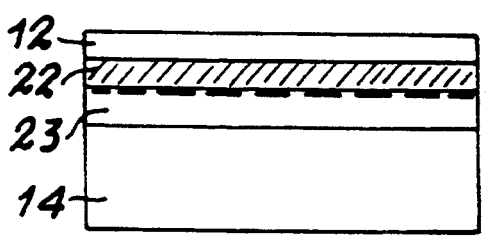

Third method (FIG. 14). This is a variant of the second method. The substrate 14 is surface-oxidized (layer 23) and the bonding (step B2) is then directly effected on the thin layer of zirconia 22. The procedure as indicated in B3 is then followed in such a manner as to obtain the structure of FIG. 14.

Figure 15:
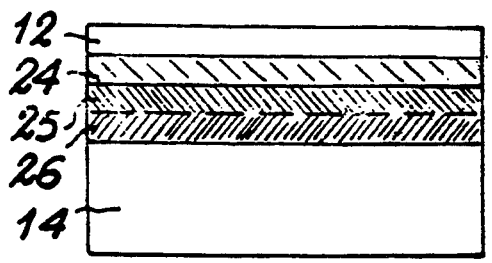

Fourth method (FIG. 15). After the deposit of a layer 24 of YSZ on the epitaxially grown silicon 12, colloidal silica 25 is deposited by a "Spin on"-type method for example, on the layer of YSZ and on the support substrate (layer 26). There then follows the bonding of the two samples, silica against silica (step B2) and the thinning (step B3).

We claim:

1. Process for hardening substrates for active electronic components of large dimensions against ionizing radiations, characterized in that their basic structure is produced by forming on a surface of a substrate of monocrystalline silicon having at least one dimension in excess of 50 mm (1) a layer (2) of "hardening" material of polycrystalline stabilized zirconia exhibiting a product $\mu.\delta$ of less than approximately $5.10^{-8}$ cm$^2$.V$^1$, $\mu$ being the mobility, expressed in cm$^2$.V$^1$s$^{-1}$, of the carriers photogenerated under ionizing radiation, and $\delta$ their lifetime expressed in seconds, and in that a layer of monocrystalline silicon (3) is formed on this layer of "hardening" material.

2. Process according to claim 1, characterized in that the zirconia is stabilized with yttrium.

3. Process according to claim 2, characterized in that the stabilized zirconia is obtained by a process of depositing a thin layer.

4. Process according to any one of the preceding claims, characterized in that in order to form the layer of monocrystalline silicon, openings are engraved in the zirconia, baring surfaces (2A) of the substrate to constitute nucleation zones, then a continuous film of silica (4') is formed, then there are made in this silica film openings (4A) corresponding to those made in the zirconia, and in that monocrystalline silicon (5) is deposited in the openings (4A) which have bared the monocrystalline silicon of the substrate, and polycrystalline silicon (6) on the silica film.

5. Process according to claim 4, characterized in that the openings engraved in the zirconia are in the form of parallel bands of a width of approximately 1 to 5 micrometers, the spacing between these bands being of a few tens to a few hundreds of micrometers.

6. Process according to claim 4, characterized in that the continuous film of silica is formed by the deposit of a continuous layer of amorphous silicon (4) which is then oxidized.

7. Process according to claim 6, characterized in that the layer of amorphous silicon has a thickness of approximately 50 Å and is deposited from silane at approximately 400° C.

8. Process according to claim 6, characterized in that the layer of amorphous silicon is thermally oxidized under an atmosphere of oxygen or of water vapour.

9. Process according to claim 4, characterized in that the monocrystalline (5) and polycrystalline (6) silicon is deposited by selective epitaxy.

10. Process according to claim 4, characterized in that the deposit of mono- and polycrystalline silicon is encapsulated, and in that it is recrystallized by fusion of the polycrystalline material, and in that the encapsulating substance is then eliminated.

11. Process according to claim 4, characterized in that the deposit of mono- and polycrystalline silicon is encapsulated (8), in that there are formed in the encapsulating substance openings situated in the central part of each deposit of polycrystalline silicon, in that this polycrystalline silicon is attacked in such a manner as to bare the lateral nuclei of monocrystalline silicon, and in that the filling of the zones left empty by the attack of the polycrystalline silicon is effected by lateral growth in the vapour phase and under conditions of selective epitaxy.

12. Process according to claim 1, characterized in that there is formed on a first substrate (13) of highly doped silicon of orientation <100> a thin layer of monocrystalline silicon, in that the "hardening" material (15,16) is disposed on the monocrystalline silicon layer deposited on this first substrate and/or on a second substrate (14) of silicon of any orientation and any dopings, and in that these two parts are assembled in such a manner that the substrates (13, 14) are on the outside, and in that the first substrate is then eliminated.

13. Process according to claim 12, characterized in that the layer of monocrystalline silicon is deposited by epitaxy and has a micron or submicron thickness.

14. Process according to one of claim 12 or 13, characterized in that the two parts are assembled by bonding at high temperature.

15. Process according to claim 12, characterized in that the first substrate is eliminated first mechanically and then mechano-chemically and finally chemically.

16. Process according to claim 12, characterized in that the "hardening" material is deposited in a thin layer (17, 18) of approximately 1 micrometer on at least one of the two substrates which are then assembled and bonded by thermal annealing.

17. Process according to claim 12, characterized in that there are deposited on the thin layer of monocrystalline silicon a thin layer of "hardening" material (19 or 22) and then a layer of amorphous silicon (20 or 23).

18. Process according to claim 17, characterized in that the layer of amorphous silicon is oxidized (20), as is the second substrate (21).

19. Process according to claim 12, characterized in that there is deposited on the thin layer of monocrystalline silicon a thin layer of "hardening" material (19) and then a layer of high-temperature silica (20), the second substrate being likewise oxidized (21).

20. Process according to claim 12, characterized in that after the deposit of "hardening" material (24) on the layer of monocrystalline silicon (12), colloidal silica is deposited on the two parts (25, 26).

* * * * *